United States Patent [19]

Shimizu et al.

[11] 4,222,105

[45] Sep. 9, 1980

[54] RECORDING APPARATUS INCLUDING ANALOG-DIGITAL CONVERTER

[75] Inventors: Katsuichi Shimizu, Hoyo; Hisashi Sakamaki, Yokohama, both of Japan

[73] Assignee: Canon Kabushiki Kaisha, Tokyo, Japan

[21] Appl. No.: 889,403

[22] Filed: Mar. 23, 1978

[30] Foreign Application Priority Data

Mar. 28, 1977 [JP] Japan .................................. 52/34123

[51] Int. Cl.² .................. G06F 15/20; G03G 15/00
[52] U.S. Cl. ........................ 364/518; 340/347 AD; 355/14 C
[58] Field of Search ............... 364/600, 601, 602, 514, 364/515, 518; 340/347 AD, 347 R, 347 SY; 355/14, 14 C

[56] References Cited

U.S. PATENT DOCUMENTS

| | | | |
|---|---|---|---|
| 3,610,896 | 10/1971 | Heid | 364/602 |
| 3,804,512 | 4/1974 | Komori et al. | 355/14 X |
| 3,872,389 | 3/1975 | Willard | 364/602 X |
| 3,876,106 | 4/1975 | Powell et al. | 355/14 X |
| 4,016,540 | 4/1977 | Hyatt | 364/200 |
| 4,062,005 | 12/1977 | Freed | 340/347 SY |

FOREIGN PATENT DOCUMENTS 1004759 9/1965 United Kingdom ..................... 364/602

*Primary Examiner*—Joseph F. Ruggiero
*Attorney, Agent, or Firm*—Fitzpatrick, Cella, Harper & Scinto

[57] ABSTRACT

Recording apparatus includes a plurality of analog signal generating circuits for generating various analog signals in response to which a control circuit of the recording apparatus controls various operations of the apparatus, and a plurality of switching circuits connected to the respective analog signal generating circuits in such a way that only one analog signal is transmitted at one time to a common analog-digital converter which coverts the received analog signal into a corresponding digital signal which in turn is transmitted to the control circuit.

11 Claims, 10 Drawing Figures

FIG. 3

| MEMORY LOCATIONS | INSTRUCTION CODES | OPERATIONS | |
|---|---|---|---|
| 100 | 0111 0100 | DESIGNATE PORT $E_0$ | |
| 101 | 0000 0000 | NOP | STEP 1 |
| 102 | " | " | |
| 103 | " | " | |
| 104 | " | " | |
| 105 | 0100 0000 | LOAD ACC WITH CONTENTS OF PORT A | STEP 2 |
| 106 | | PROCESSING ROUTINE WITH DIGITAL SIGNAL A1 | STEP 3 |
| ⌇ | | | |
| 199 | | | |
| 200 | 0111 0101 | DESIGNATE PORT $E_1$ | |
| 201 | 0000 0000 | NOP | STEP 4 |
| 202 | " | " | |
| 203 | " | " | |
| 204 | " | " | |
| 205 | 0100 0000 | | STEP 5 |
| 206 | | PROCESSING ROUTINE WITH DIGITAL SIGNAL A2 | STEP 6 |
| ⌇ | | | |
| 299 | | | |
| 300 | 0111 0110 | | |
| 301 | 0000 0000 | | |
| 302 | " | | STEP 7 |
| 303 | " | | |
| 304 | " | | |
| 305 | 0100 0000 | | STEP 8 |
| 306 | | PROCESSING ROUTINE WITH DIGITAL SIGNAL A3 | STEP 9 |
| ⌇ | | | |
| 399 | | | |

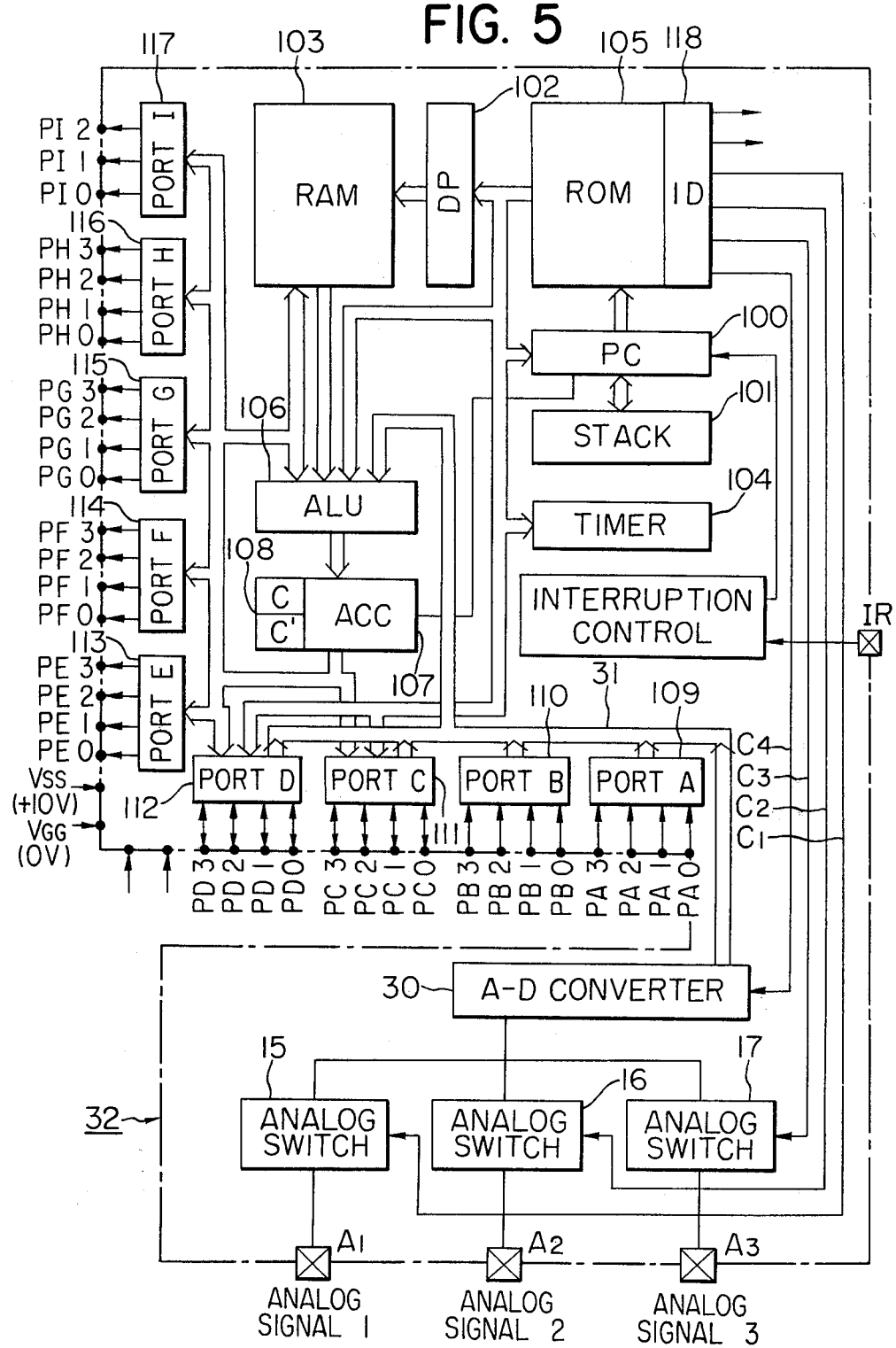

RECORDING APPARATUS INCLUDING ANALOG-DIGITAL CONVERTER

BACKGROUND OF THE INVENTION

1. Field of the Invention

The present invention relates to generally apparatus for recording data or information upon a recording medium and more particularly recording apparatus of the type described and incorporating an analog-to-digital (to be referred to "analog-digital" in this specification) converter.

2. Description of the Prior Art

The recent trend of the recording apparatus is toward the extensive use of computers as disclosed in for instance U.S. Pat. No. 3,936,182. The microcomputers however operate on binary digits "1" and "0" or digitally so that analog electrical signals derived by photo-electric conversion, magneto-electric conversion and thermo-electric conversion for attaining an optimum operation of the recording apparatus must be converted into corresponding digital signals by semiconductor linear integrated circuits and circuits consisting of various combinations of discrete circuit elements such as transistors, resistors, capacitors, inductors and the like, both of which circuits are external to the microcomputer. As a result, the number of electrical elements is in proportion to the number of analog signals to be processed or converted into digital signals so that the principal and fundamental objects of the use of a microcomputer for increasing the packing density, improving the reliability and reducing the cost are adversely affected.

In order to overcome the above and other problems, there has been proposed a method wherein analog-digital converters each in the form of an integrated circuit are combined with the photo-electric, magneto-electric and thermo-electric converters. However these analog-digital converters are of CMOS type and of a sequential-comparison type. Therefore because of the difficulty of integrating a large number of circuit elements at a high packing density and because of a small demand for the analog-digital converters themselves, the cost is still very high. Thus the combination of the photo-electric, magneto-electric and thermo-electric converters with the analog-digital converter will result in complex circuitry and an increase in cost of the recording apparatus.

SUMMARY OF THE INVENTION

Accordingly, one of the objects of the present invention is to provide recording apparatus incorporating an analog-digital converter which is significantly simple in circuit configuration.

Another object of the present invention is to provide recording apparatus incorporating a minimum number of analog-digital converters.

A further object of the present invention is to provide recording apparatus incorporating an analog-digital converter which can be manufactured at a minumum cost.

To the above and other ends, briefly stated the present invention provides recording apparatus incorporating an analog-digital converter wherein a plurality of analog signals may be sequentially transmitted one at a time to a common analog-digital converter.

BRIEF DESCRIPTION OF THE DRAWINGS

FIG. 3 shows a list of instruction codes stored in a read-only memory;

FIG. 5 is a schematic block diagram of a second embodiment of the present invention;

The same reference numerals are used to designate similar parts throughout the figures.

DESCRIPTION OF THE PREFERRED EMBODIMENTS

First Embodiment, FIGS. 1–4

Figure 1:
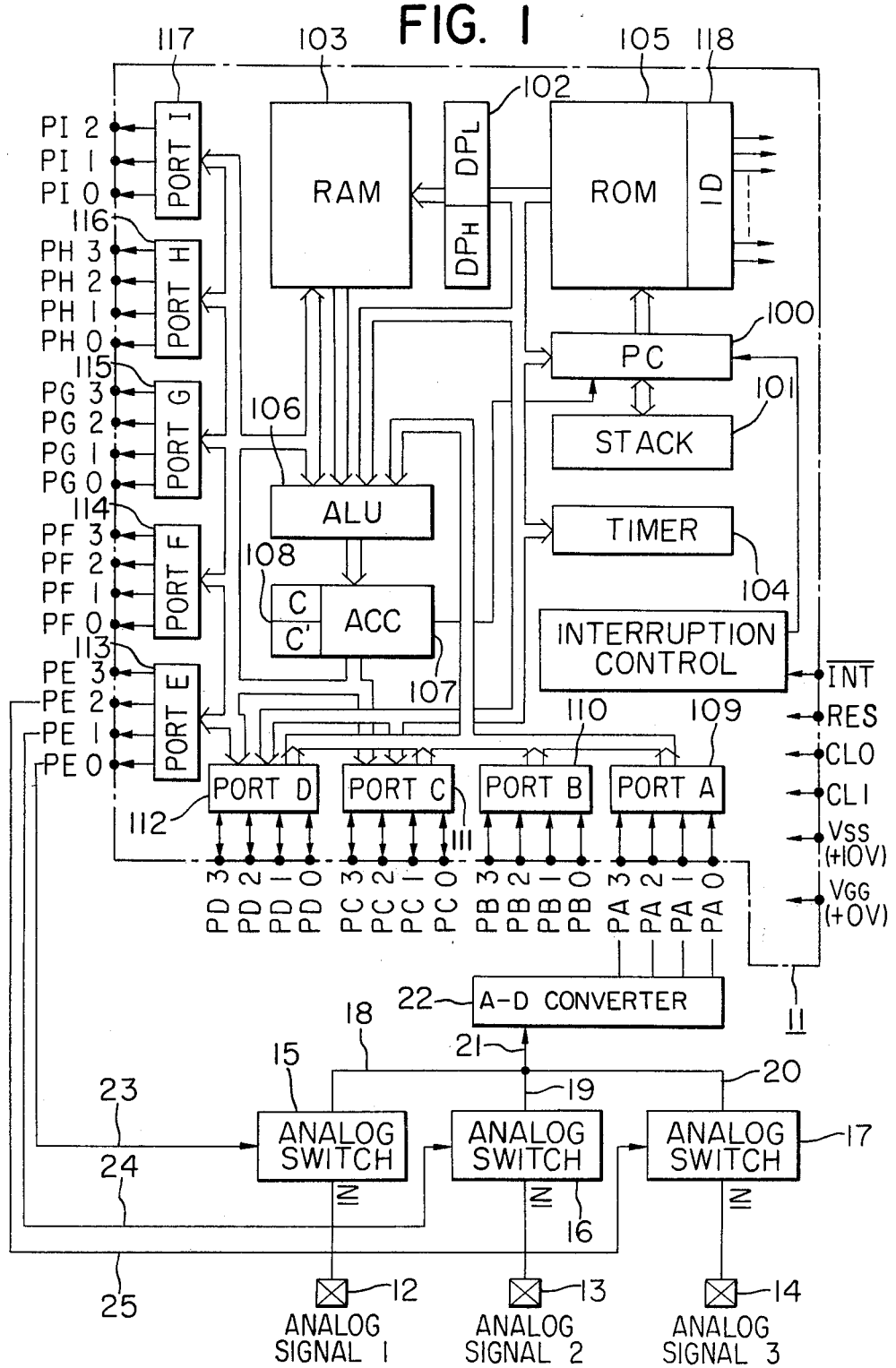
FIG. 1 is a schematic block diagram of a first embodiment of recording apparatus incorporating an analog-digital converter in accordance with the present invention.

Referring to the accompanying drawings and particularly to FIG. 1, a first embodiment of recording apparatus incorporating an analog-digital converter in accordance with the present invention will be described. A microcomputer generally indicated by the reference numeral 11 is a commercially available product sold under the trade name "μPD546C (μCOM-43)" from NIPPON ELECTRIC CO., LTD., Japan. It includes a program counter 100 for storing an address of a program sequence stored in a read-only memory ROM 105; a stack register STACK 101 for saving the contents of the program counter PC 100 when a subroutine is executed; a data pointer DP 102 which has access to an address of a random access memory RAM 103 which stores data; a timer 104, the read-only memory ROM 105 for storing the program sequences; and arithmetic and logic unit ALU 106 whose outputs are stored in an accumulating storage or accumulator ACC 107 and used to set a carry flip-flop or status flag 108; and input and output ports 109 through 117. The ports 109 and 110 are input ports; the ports 111 and 112 are input-output ports; and the ports 113–117 are output ports. The output port 117 consists of a three-bit flip-flop while the remaining ports 109 through 116 each consist of a four-bit flip-flop. The input ports are connected to terminals PA, PB and A shown in FIG. 7 while the output ports are connected to terminals P1, PH and PE. The microcomputer of the type described and shown in FIG. 1 is called a one-chip microcomputer wherein the circuits or logic 100 through 117 are implemented on a single chip and which may be incorporated in a control circuit for an electronic copying device of the type disclosed in Japanese Patent Application No. 22981/1977 or No. 22982/1977 assigned to the same assignee. Since the present invention however is not directed to the control circuit proper of the type described and for the sake of simplicity, the control circuit will not be described in detail in this specification.

Figure 7:
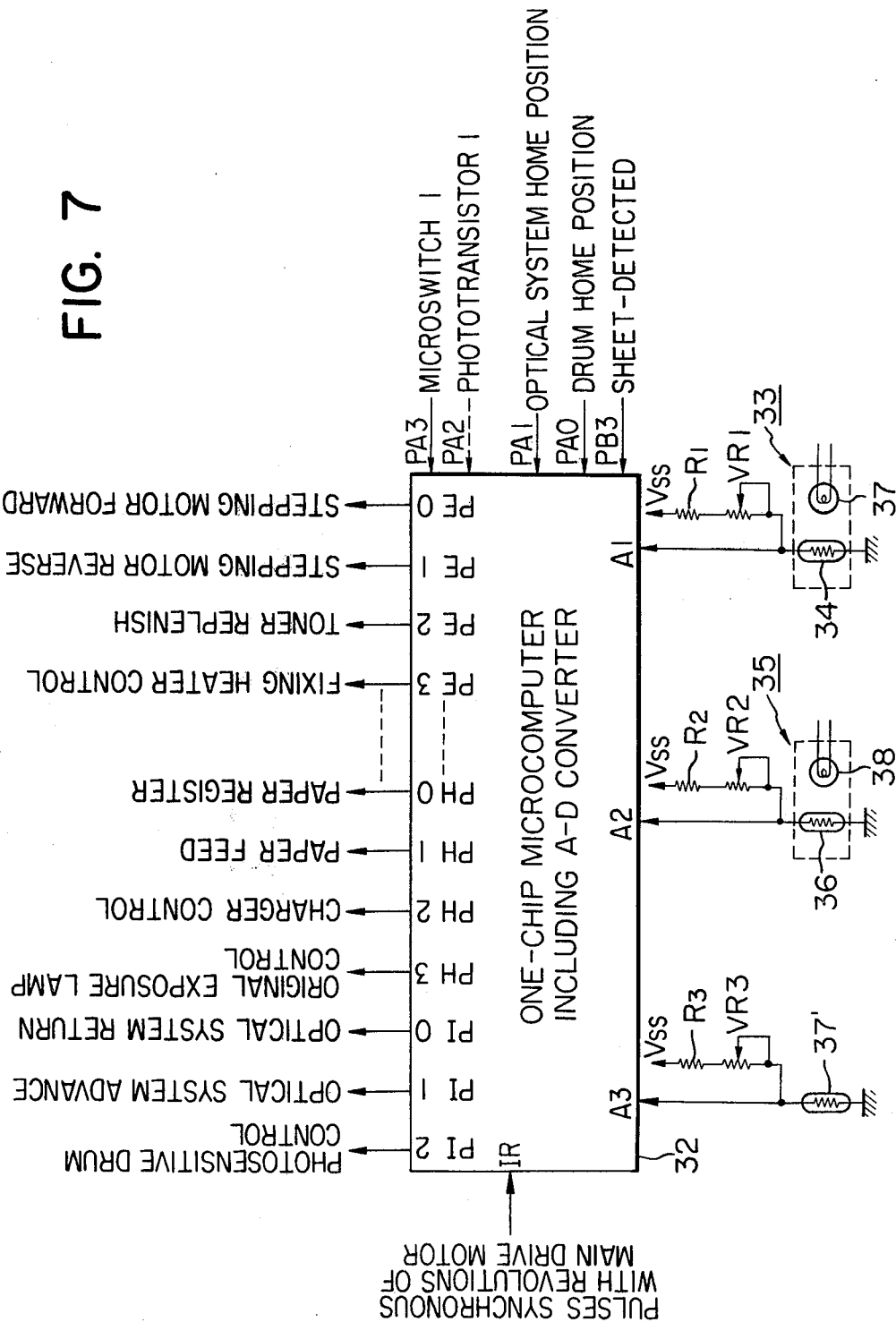
FIG. 7 shows the relation of the circuit shown in FIG. 5 with various peripheral equipment and input and output signals.

Referring still to FIG. 1, analog signals 1, 2 and 3 representing some analog values are applied to terminals 12, 13 and 14, respectively. As shown in FIG. 7, a first analog signal may be generated from a circuit consisting of a resistor R3, a variable resistor VR3 and a thermistor 37'. In a like manner a second analog signal 2 may be generated from a circuit consisting of a resistor R2, a variable resistor VR2, a CdS device 36 and a lamp 38 while a third analog signal 3 may be generated from a circuit consisting of a resistor R1, a variable resistor VR1, a CdS component 34 and a lamp 37.

These analog signal input terminals 12, 13 and 14 are connected to analog switches 15, 16 and 17, respectively, which in turn are connected through output lines 18, 19, 20 and 21 to a common analog-digital converter 22 (which may be for instance a product of ANALOG DEVICES CORP. under the trade name of "AD7570"). The ON-OFF operations of the analog switches 15, 16 and 17 are controlled in response to control signals which appear at terminals PE0, PE1 and PE2 of the port 113 of the microcomputer 11. More particularly, the terminal PE0 is connected to a control terminal of the analog switch 15; the terminal PE1, to a control terminal of the analog switch 16; and the terminal PE2, to a control terminal of the analog switch 17.

When the control signal at the terminal PE0 is a logical "1", the analog switch 15 is turned on, whereby the analog signal 1 is applied to the A-D converter 22. In a like manner, in response to the control signal "1" at the terminal PE1 or PE2, the analog switch 16 or 17 is turned on whereby the analog signal 2 or 3 is applied to the A-D converter 22. On the other hand, in response to the control signal "0", the analog switches 15, 16 and 17 are turned off. It should be noted that only one of these analog switches 15, 16 and 17 is turned on at one time while the remaining two switches are kept turned off.

The analog signal applied to the A-D converter 22 may be converted into a digital signal within a very short time period. The A-D converter 22 develops a four-bit output signal to the input port 109 of the microcomputer 11. Thus the resolution of the output is four bits, which means that an analog signal with a maximum value of for instance 10 volts may be divided into $10 \times \frac{1}{2}^4$ discrete steps.

Figure 2:
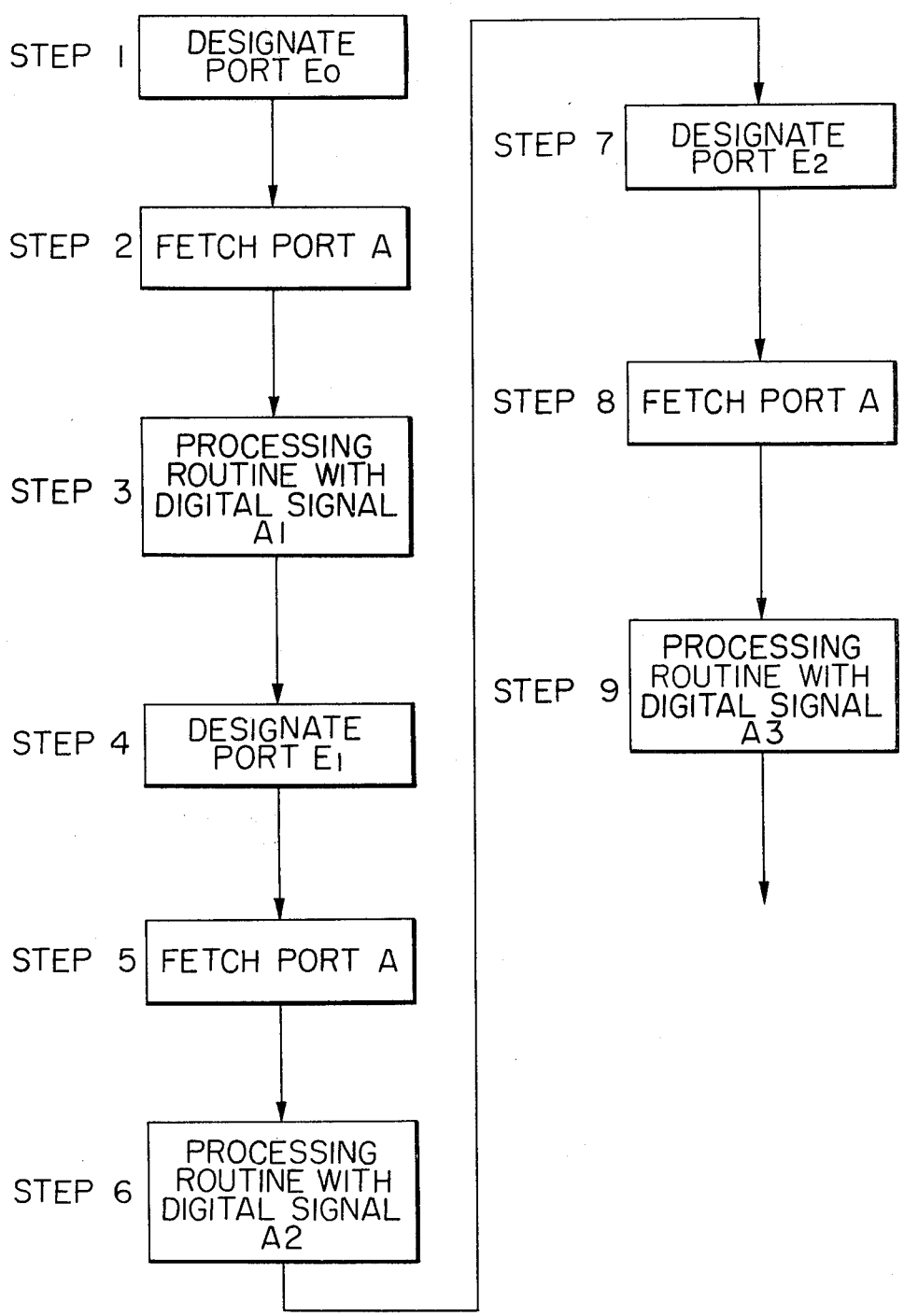
FIG. 2 is a flow chart used for the explanation of the mode of operation of the first embodiment shown in FIG. 1.

Next, referring further to FIGS. 2 and 3, the mode of operation of the first embodiment with the above construction will be described. FIG. 3 shows instruction codes stored in memory locations starting from an address 100 in the read-only memory ROM 105.

In order to clearly understand the description of the preferred embodiments in accordance with the invention, the instructions used in the aforementioned microprocessor μPD546C are shown in the following tables.

| Mnemonic. | $D_7$ | $D_6$ | $D_5$ | $D_4$ | $D_3$ | $D_2$ | $D_1$ | $D_0$ | Bytes. | Machine Cycles. | Operation. | Condition for Skip. |
|---|---|---|---|---|---|---|---|---|---|---|---|---|
| CLA | 1 | 0 | 0 | 1 | 0 | 0 | 0 | 0 | 1 | 1 | Acc ← 0 | |
| CLC | 0 | 0 | 0 | 0 | 1 | 0 | 1 | 1 | 1 | 1 | C ← 0 | |
| CMA | 0 | 0 | 0 | 1 | 0 | 0 | 0 | 0 | 1 | 1 | Acc ← ($\overline{Acc}$) | |
| CIA | 0 | 0 | 0 | 1 | 0 | 0 | 0 | 1 | 1 | 1 | Acc ← ($\overline{Acc}$) + 1 | |
| INC | 0 | 0 | 0 | 0 | 1 | 1 | 0 | 1 | 1 | ½–3 | Acc ← (Acc) + 1 skip if Carry | Carry |
| DEC | 0 | 0 | 0 | 0 | 1 | 1 | 1 | 1 | 1 | ½–3 | Acc ← (Acc) − 1 skip if Borrow | Borrow |
| STC | 0 | 0 | 0 | 1 | 1 | 0 | 1 | 1 | 1 | 1 | C ← 1 | |
| XC | 0 | 0 | 0 | 1 | 1 | 0 | 1 | 0 | 1 | 1 | (C) ⇄ (C') | |
| RAR | 0 | 0 | 1 | 1 | 0 | 0 | 0 | 0 | 1 | 1 | (C) → $Acc_3$, $(Acc_a)$ → $(Acc_{a-1})$; $(Acc_n)$ → C | |
| INM | 0 | 0 | 0 | 1 | 1 | 1 | 0 | 1 | 1 | ½–3 | [(DP)] ← [(DP)] + 1 skip if [(DP)] = 0 | [(DP)] = 0 |
| DEM | 0 | 0 | 0 | 1 | 1 | 1 | 1 | 1 | 1 | ½–3 | [(DP)] ← [(DP)] − 1 skip if [(DP)] = F | [(DP)] = F |
| AD | 0 | 0 | 0 | 0 | 1 | 0 | 0 | 0 | 1 | ½–3 | Acc ← (Acc) + [(DP)] skip if Carry | Carry |
| ADS | 0 | 0 | 0 | 0 | 1 | 0 | 0 | 1 | 1 | ½–3 | Acc, C ← (Acc) + [(DP)] + (C) skip if Carry | Carry |
| ADC | 0 | 0 | 0 | 1 | 1 | 0 | 0 | 1 | 1 | 1 | Acc, C ← (Acc) + [(DP)] + (C) | |
| DAA | 0 | 0 | 0 | 0 | 0 | 1 | 1 | 0 | 1 | 1 | Acc ← (Acc) + 6 | |
| DAS | 0 | 0 | 0 | 0 | 1 | 0 | 1 | 0 | 1 | 1 | Acc ← (Acc) + 10 | |
| EXL | 0 | 0 | 0 | 1 | 1 | 0 | 0 | 0 | 1 | 1 | Acc ← (Acc) ⊻ [(DP)] | |
| LI | 1 | 0 | 0 | 1 | $I_3$ | $I_2$ | $I_1$ | $I_0$ | 1 | 1 | Acc ← $I_3I_2I_1I_0$ | |

-continued

| Mnemonic | $D_7$ | $D_6$ | $D_5$ | $D_4$ | $D_3$ | $D_2$ | $D_1$ | $D_0$ | Bytes | Machine Cycles | Operation | Condition for Skip |
|---|---|---|---|---|---|---|---|---|---|---|---|---|
| S | 0 | 0 | 0 | 0 | 0 | 0 | 1 | 0 | 1 | 1 | $[(DP)] \leftarrow (Acc)$ | |
| L | 0 | 0 | 1 | 1 | 1 | 0 | 0 | 0 | 1 | 1 | $Acc \leftarrow [(DP)]$ | |
| LM | 0 | 0 | 1 | 1 | 1 | 0 | $M_1$ | $M_0$ | 1 | 1 | $Acc \leftarrow [(DP)]$<br>$DP_H \leftarrow (DP_H) \vee M_1M_0$ | |
| X | 0 | 0 | 1 | 0 | 1 | 0 | 0 | 0 | 1 | 1 | $(Acc) \rightleftarrows [(DP)]$ | |
| XM | 0 | 0 | 1 | 0 | 1 | 0 | $M_1$ | $M_0$ | 1 | 1 | $(Acc) \rightleftarrows [(DP)]$<br>$DP_H \leftarrow (DP_H) \vee M_1M_0$ | |
| XD | 0 | 0 | 1 | 0 | 1 | 1 | 0 | 0 | 1 | ½-3 | $(Acc) \rightleftarrows [(DP)]$<br>$DP_L \leftarrow (DP_L) - 1$<br>skip if $(DP_L) = F$ | $(DP_L) = F$ |
| XMD | 0 | 0 | 1 | 0 | 1 | 1 | $M_1$ | $M_0$ | 1 | ½-3 | $(Acc) \rightleftarrows [(DP)]$<br>$DP_H \leftarrow (DP_H) \vee M_1M_0$<br>$DP_L \leftarrow (DP_L) - 1$<br>skip if $(DP_L) = F$ | $(DP_L) = F$ |
| XI | 0 | 0 | 1 | 1 | 1 | 1 | 0 | 0 | 1 | ½-3 | $(Acc) \rightleftarrows [(DP)]$<br>$DP_L \leftarrow (DP_L) + 1$<br>skip $(DP_L) = 0$ | $(DP_L) = 0$ |
| XMI | 0 | 0 | 1 | 1 | 1 | 1 | $M_1$ | $M_0$ | 1 | ½-3 | $(Acc) \rightleftarrows [(DP)]$<br>$DP_H \leftarrow (DP_H) \vee M_1M_0$<br>$DP_L \leftarrow (DP_L) + 1$<br>skip if $(DP_L) = 0$ | $(DP_L) = 0$ |
| LDI | 0 | 0 | 0 | 1 | 0 | 1 | 0 | 1 | 2 | 2 | $DP \leftarrow I_6-I_0$ | |
|  | 0 | $I_6$ | $I_5$ | $I_4$ | $I_3$ | $I_2$ | $I_1$ | $I_0$ | | | | |
| LDZ | 1 | 0 | 0 | 0 | $I_3$ | $I_2$ | $I_1$ | $I_0$ | 1 | 1 | $DP_H \leftarrow 0$<br>$DP_L \leftarrow I_3I_2I_1I_0$ | |
| DED | 0 | 0 | 0 | 1 | 0 | 0 | 1 | 1 | 1 | ½-3 | $DP_L \leftarrow (DP_L) - 1$<br>skip if $(DP_L) = F$ | $(DP_L) = F$ |
| IND | 0 | 0 | 1 | 1 | 0 | 0 | 1 | 1 | 1 | ½-3 | $DP_L \leftarrow (DP_L) + 1$<br>skip if $(DP_L) = 0$ | $(DP_L) = 0$ |
| TAL | 0 | 0 | 0 | 0 | 0 | 1 | 1 | 1 | 1 | 1 | $DP_L \leftarrow (Acc)$ | |
| TLA | 0 | 0 | 0 | 1 | 0 | 0 | 1 | 0 | 1 | 1 | $Acc \leftarrow (DP_L)$ | |
| XHX | 0 | 1 | 0 | 0 | 1 | 1 | 1 | 1 | 1 | 2 | $(DP_H) = (X)$ | |
| XLY | 0 | 1 | 0 | 0 | 1 | 1 | 1 | 0 | 1 | 2 | $(DP_L) = (Y)$ | |
| THX | 0 | 1 | 0 | 0 | 0 | 1 | 1 | 1 | 1 | 2 | $(DP_H) \rightarrow X$ | |
| TLY | 0 | 1 | 0 | 0 | 0 | 1 | 1 | 0 | 1 | 2 | $(DP_L) \rightarrow Y$ | |
| XAZ | 0 | 1 | 0 | 0 | 1 | 0 | 1 | 0 | 1 | 2 | $(Acc) \rightleftarrows (Z)$ | |
| XAW | 0 | 1 | 0 | 0 | 1 | 0 | 1 | 1 | 1 | 2 | $(Acc) \rightleftarrows (W)$ | |
| JPA | 0 | 1 | 0 | 0 | 0 | 0 | 0 | 1 | 1 | 2 | $PC \leftarrow A_3A_2A_1A_000$ | |
| EI | 0 | 0 | 1 | 1 | 0 | 0 | 0 | 1 | 1 | 1 | INTE F/F $\leftarrow 1$ | |
| DI | 0 | 0 | 0 | 0 | 0 | 0 | 0 | 1 | 1 | 1 | INTE F/F $\leftarrow 0$ | |
| CZP | 1 | 0 | 1 | 1 | $P_3$ | $P_2$ | $P_1$ | $P_0$ | 1 | 1 | $(PC) \rightarrow$ STACK<br>$PC \leftarrow 00000P_3P_2P_1P_000$ | |
| CAL | 1 | 0 | 1 | 0 | 1 | $P_{10}$ | $P_9$ | $P_8$ | 2 | 2 | $(PC) \rightarrow$ STACK<br>$PC \leftarrow P_{10}-P_0$ | |
|  | $P_7$ | $P_6$ | $P_5$ | $P_4$ | $P_3$ | $P_2$ | $P_1$ | $P_0$ | | | | |
| RT | 0 | 1 | 0 | 0 | 1 | 0 | 0 | 0 | 1 | 2 | $PC \leftarrow$ (STACK) | |
| RTS | 0 | 1 | 0 | 0 | 1 | 0 | 0 | 1 | 1 | 3-4 | $PC \leftarrow$ (STACK)<br>$PC \leftarrow (PC) + 1,2$ | Unconditional |
| SEB | 0 | 1 | 1 | 1 | 0 | 1 | $B_1$ | $B_0$ | 1 | 2 | PORT $E(B_1B_0) \leftarrow 1$ | |
| REB | 0 | 1 | 1 | 0 | 0 | 1 | $B_1$ | $B_0$ | 1 | 2 | PORT $E(B_1B_0) \leftarrow 0$ | |
| SPB | 0 | 1 | 1 | 1 | 0 | 0 | $B_1$ | $B_0$ | 1 | 1 | $PORT(DT_L,B_1B_0) \leftarrow 1$ | |
| RPB | 0 | 1 | 1 | 0 | 0 | 0 | $B_1$ | $B_0$ | 1 | 1 | $PORT(DP_L,B_1B_0) \leftarrow 0$ | |

-continued

| Mnemonic | $D_7$ | $D_6$ | $D_5$ | $D_4$ | $D_3$ | $D_2$ | $D_1$ | $D_0$ | Bytes | Machine Cycles | Operation | Condition for Skip |
|---|---|---|---|---|---|---|---|---|---|---|---|---|
| TPA | 0 | 1 | 0 | 1 | 0 | 1 | $B_1$ | $B_0$ | 1 | 1–4 | skip if (PORT A($B_1B_0$)) = 1 | (PORT A ($B_1B_0$)) = 1 |
| TPB | 0 | 1 | 0 | 1 | 0 | 0 | $B_1$ | $B_0$ | 1 | 1–3 | skip if (PORT($DP_L,B_1B_0$)) = 1 | (PORT($DP_L$, $B_1B_0$)) = 1 |
| OE | 0 | 1 | 0 | 0 | 0 | 1 | 0 | 0 | 1 | 2 | PORT E ← (Acc) | |
| OP | 0 | 0 | 0 | 0 | 1 | 1 | 1 | 0 | 1 | 1 | PORT($DP_L$) ← (Acc) | |
| OCD | 0 | 0 | 0 | 1 | 1 | 1 | 1 | 0 | 2 | 2 | PORT C,D ← $I_7$-$I_0$ | |
|  | $I_7$ | $I_6$ | $I_5$ | $I_4$ | $I_3$ | $I_2$ | $I_1$ | $I_0$ | | | | |
| IA | 0 | 1 | 0 | 0 | 0 | 0 | 0 | 0 | 1 | 2 | (PORT A) → Acc | |
| IP | 0 | 0 | 1 | 1 | 0 | 0 | 1 | 0 | 1 | 1 | (PORT($DP_L$)) → Acc | |
| STM | 0 | 0 | 0 | 1 | 0 | 1 | 0 | 0 | 2 | 2 | TMF/F ← 0 | |
|  | 1 | 0 | $I_5$ | $I_4$ | $I_3$ | $I_2$ | $I_1$ | $I_0$ | | | TIMER ← $I_5$-$I_0$ | |
| NOP | 0 | 0 | 0 | 0 | 0 | 0 | 0 | 0 | 1 | 1 | No Operation | |
| TAZ | 0 | 1 | 0 | 0 | 0 | 0 | 1 | 0 | 1 | 2 | (Acc) → Z | |
| TAW | 0 | 1 | 0 | 0 | 0 | 0 | 1 | 1 | 1 | 2 | (Acc) → W | |
| XHR | 0 | 1 | 0 | 0 | 1 | 1 | 0 | 1 | 1 | 2 | ($DP_H$) ⇌ (R) | |
| XLS | 0 | 1 | 0 | 0 | 1 | 1 | 0 | 0 | 1 | 2 | ($DP_L$) ⇌ (S) | |
| SMB | 0 | 1 | 1 | 1 | 1 | 0 | $B_1$ | $B_0$ | 1 | 1 | [(DP,$B_1B_0$)] ← 1 | |
| RMB | 0 | 1 | 1 | 0 | 1 | 0 | $B_1$ | $B_0$ | 1 | 1 | [(DP,$B_1B_0$)] ← 0 | |
| TMB | 0 | 1 | 0 | 1 | 1 | 0 | $B_1$ | $B_0$ | 1 | 1–3 | skip if [(DP,$B_1B_0$)] = 1 | [(DP,$B_1B_0$)] = 1 |
| TAB | 0 | 0 | 1 | 0 | 0 | 1 | $B_1$ | $B_0$ | 1 | 1–3 | skip if (Acc($B_1B_0$)) = 1 | (Acc($B_1B_0$)) = 1 |
| CMB | 0 | 0 | 1 | 1 | 0 | 1 | $B_1$ | $B_0$ | 1 | 1–3 | skip if (Acc($B_1B_0$)) = [(DP,$B_1B_0$)] | (Acc($B_1B_0$)) = [(DP,$B_1B_00$)] |
| SFB | 0 | 1 | 1 | 1 | 1 | 1 | $B_1$ | $B_0$ | 1 | 2 | FLAG($B_1B_0$) ← 1 | |
| RFB | 0 | 1 | 1 | 0 | 1 | 1 | $B_1$ | $B_0$ | 1 | 2 | FLAG($B_1B_0$) ← 0 | |
| FBT | 0 | 1 | 0 | 1 | 1 | 1 | $B_1$ | $B_0$ | 1 | 1–4 | skip if (FLAG($B_1B_0$)) = 1 | (FLAG($B_1B_0$)) = 1 |
| FBF | 0 | 0 | 1 | 0 | 0 | 0 | $B_1$ | $B_0$ | 1 | 1–4 | skip if (FLAG($B_1B_0$)) = 0 | (FLAG($B_1B_0$)) = 1 |
| CM | 0 | 0 | 0 | 0 | 1 | 1 | 0 | 0 | 1 | 1–3 | skip if (Acc) = [(DP)] | (Acc) = [(DP)] |
| CI | 0 | 0 | 0 | 1 | 0 | 1 | 1 | 1 | 2 | 1–4 | skip if (Acc) = $I_3I_2I_1I_0$ | (Acc) = $I_3I_2I_1I_0$ |
|  | 1 | 1 | 0 | 0 | $I_4$ | $I_2$ | $I_1$ | $I_0$ | | | | |
| CLI | 0 | 0 | 0 | 1 | 0 | 1 | 1 | 0 | 2 | 1–4 | skip if ($DP_L$) = $I_3I_2I_1I_0$ | ($DP_L$) = $I_3I_2I_1I_0$ |
|  | 1 | 1 | 1 | 0 | $I_4$ | $I_2$ | $I_1$ | $I_0$ | | | | |
| TC | 0 | 0 | 0 | 0 | 0 | 1 | 0 | 0 | 1 | 1–3 | skip if (C) = 1 | (C) = 1 |
| TTM | 0 | 0 | 0 | 0 | 0 | 1 | 0 | 1 | 1 | 1–3 | skip if (TM F/F) = 1 | (TM F/F) = 1 |
| TIT | 0 | 0 | 0 | 0 | 0 | 0 | 1 | 1 | 1 | 1–3 | skip if (INT F/F) = 1; INT F/F ← 0 | (INT F/F) = 1 |
| JCP | 1 | 1 | $P_5$ | $P_4$ | $P_3$ | $P_2$ | $P_1$ | $P_0$ | 1 | 1 | PC ← $P_5$-$P_0$ | |
| JMP | 1 | 0 | 1 | 0 | 0 | $P_{10}$ | $P_9$ | $P_8$ | 2 | 2 | PC ← $P_{10}$-$P_0$ | |

-continued

|  | Instruction Code. | | | | | | | | | | |
|---|---|---|---|---|---|---|---|---|---|---|---|
| Mnemonic. | D7 | D6 | D5 | D4 | D3 | D2 | D1 | D0 | Bytes. | Machine Cycles. | Operation. | Condition for Skip. |
|  | P7 | P6 | P5 | P4 | P3 | P2 | P1 | P0 | | | | |

Note:
Acc : Accumulator
An : Accumulator bit n
C : Carry F/F
C' : Carry save F/F
Carry : Carry bit generated in Acc, (but does not necessarily set C).
Borrow : Borrow generated in Acc, (but does not affect C).
DP : Data pointer
PC : Program counter
X : Working register X
Y : Working register Y
Z : Working register Z
W : Working register W
R : Working register R
S : Working register S
FLAG : Flag register
TM F/F : Timer F/F
TIMER : Timer
INT F/F : Interrupt F/F
INTE F/F : Interrupt Enable F/F
STACK : Stack register
PORT : Input/output port
( ) : Contents
[(XX)] : Memory data addressed by (DP) or the bit of the port specified by (DP, $B_1B_0$).
← : Transfer or transfer of result.
⇌ : Exchange
⊻ :Logical exclusive OR.
1 : Set
0 : Reset In the first step, the microcomputer 11 produces the control signal "1" from the terminal PE0 of the port 113, whereby the first analog switch 12 is turned on. To this end, the microcomputer 11 reads the contents "01110100" of the memory location with the address 100 designated by the contents of the program counter 100 and interprets the instruction code so that the control signal "1" appears at the terminal PE0 of the port 113. Then the first analog switch 15 is turned on while the remaining switches 16 and 17 are kept turned off so that the first analog signal 1 is applied to the A-D converter 22 and a four-bit digital signal appears at the output terminal of the A-D converter 22. However it takes some period of time for the A-D converter 22 to convert the analog signal into the digital signal so that "NO OPERATION" code or timing filler is stored in each of the memory locations with the addresses 101 through 104. Therefore the microcomputer 11 waits until the four-bit digital output signal is derived from the A-D converter 22. In the first embodiment a memory read instruction cycle or period is approximately 10 microseconds so that the microcomputer 11 must wait for approximately 40 microseconds before it executes the second step. However a time required for an analog-digital conversion is different from one converter to another, but at least approximately 10 microseconds is required so that at least one no-operation instruction NOP must be inserted.

In the second step, the microcomputer 11 reads the contents of the memory location with the address 105 so that the digital signal at the input port 109 is moved into the accumulator ACC 107.

Upon completion of the second step, the digital signal A1 which has been converted from the analog signal 1 is stored in the accumulator ACC 107 so that a predetermined processing routine may be started in response to the digital signal A1 in the accumulator 107. The routine may be such that the digital signal A1 is so processed as to derive a desired control signal.

In a like manner, in the fourth and fifth steps, the microcomputer 11 produces the analog switch 16 is turned on and consequently the second analog signal 2 is applied to the A-D converter 22. The second digital signal A2 at the port 109 is stored in the accumulator 107. In the sixth step a predetermined processing routine such as deriving a desired control signal from the digital signal A2 may be executed.

In a similar manner, in the steps 7 and 8, the control signal "1" appears at the terminal PE 2 of the port 113 so that the third analog switch 17 is turned on and consequently the analog signal 3 is applied to the A-D converter 22. Thereafter the third digital signal A3 at the port 109 is transferred to the accumulator 107, and in the ninth step a predetermined processing routine is executed in response to the contents of or the third digital signal A3 in the accumulator 107.

Thus with one A-D converter 22 a plurality of analog signals may be converted into corresponding digital signals which may be sequentially processed in the manner described above.

Figure 4:
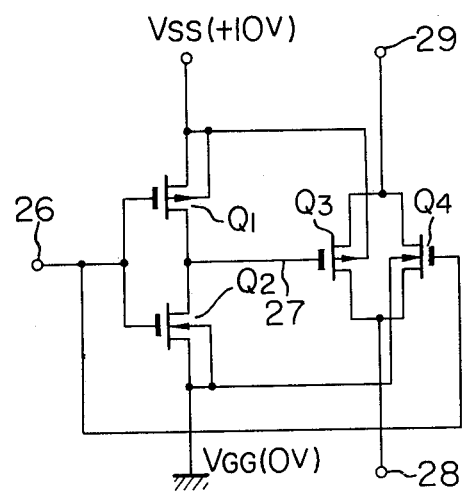
FIG. 4 is a circuit diagram of an analog switch of the first embodiment shown in FIG. 1.

FIG. 4 shows a circuit diagram of the analog switches 15, 16 and 17. Each analog switch comprises P-channel MOS transistors Q1 and Q3 and N-channel MOS transistors Q2 and Q3. When a relative voltage at the control terminal 26 is at a low level "L", the transistor Q1 is enabled while the transistor Q2 is disabled so that a voltage on a signal line 27 rises to a high level "H". As a result, the transistor Q3 is disabled. Since the control terminal 26 is at a low level "L", the transistor Q4 remains disabled. Therefore the analog signal at an input terminal 28 is not transmitted to an output terminal 29.

However when the control terminal 26 rises to a high level "H", the transistor Q1 is disabled while the transistor Q2 is enabled so that the signal line 27 drops to a low level "L". Consequently both transistors Q3 and Q4 are enabled, whereby the analog signal at the input terminal 28 is transmitted to the output terminal 29.

The analog switches 15, 16 and 17 of the type described above with reference to FIG. 4 are compatible with the A-D converter 22 and the microcomputer 11 both of which consist of MOS FETs so that they may be implemented on a single chip as an LSI.

Figure 6:
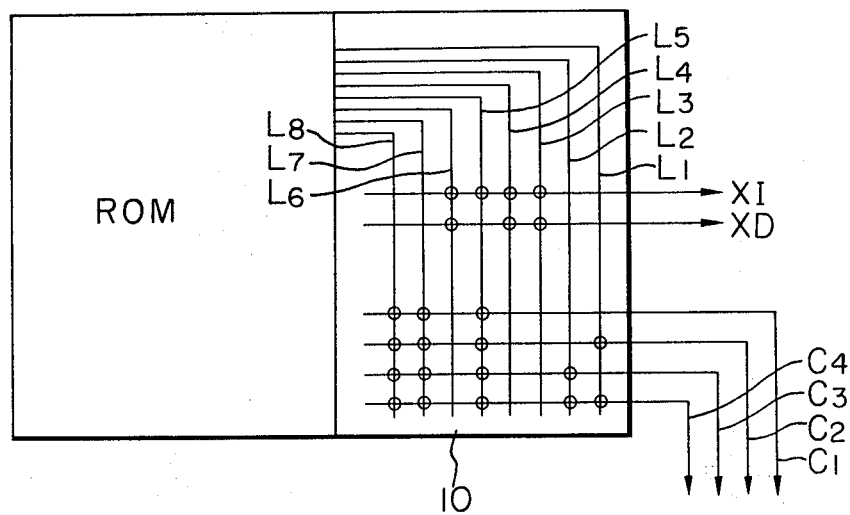
FIG. 6 is a schematic circuit diagram of an instruction decoder thereof.

Second Embodiment, FIGS. 5-7

A second embodiment of the present invention to be described in detail below with reference to FIGS. 5, 6 and 7 includes such an LSI 32 containing the components encircled by the chain line. The LSI 32 includes an analog-digital converter 30 with four-bit resolution (which is substantially similar in construction to the A-D converter COM-43 shown in FIG. 1). The output of the A-D converter 30 is connected to a data bus 31.

Terminals A1, A2 and A3 to which are applied the analog signals 1, 2 and 3, respectively, (which may be generated in a manner substantially similar to that described in conjunction with the first embodiment) are connected to the first, second and third analog switches 15, 16 and 17, respectively, which in turn are connected to the A-D converter 30.

The transmission of the analog signals 1, 2 and 3 from the input terminals A1, A2 and A3 through the analog switches 15, 16 and 17 to the A-D converter and the transmission of the four-bit digital output signal from the A-D converter 30 to the data bus 31 are controlled in response to the control signals which are derived by the decoding in an instruction decoder ID 118 of instruction codes read out from the read-only memory 105 and transmitted from the instruction decoder ID 118 through signal lines C1, C2, C3 and C4.

Therefore in addition to the instruction codes described above in conjunction with the first embodiment, the read-only memory ROM 105 further includes four additional instruction codes:

(a) an instruction code for turning on the first analog switch 15 thereby transferring the first analog signal 1 at the terminal A1 to the A-D converter 30;

(b) an instruction code for turning on the second analog switch 16 thereby transferring the second analog signal 2 at the second input terminal A2 to the A-D converter 30;

(c) an instruction signal for turning on the third analog switch 17 thereby transferring the third analog signal 3 at the third input terminal A3 to the A-D converter 30; and (d) an instruction code for storing the output from the A-D converter 30 into the accumulator 107.

Such instruction codes may be selected from not-used codes of the COM 43 converter. For instance, the instruction code (a) may be "11010000"; the instruction code (b), "11010001"; the instruction code (c), "11010010"; and the instruction code (d), "11010011".

Therefore the instruction decoder ID 118 must be modified as shown in FIG. 6. An eight-digit instruction code read out from the read-only memory ROM appears on eight signal lines L1 through L8. The matrix is so arrayed that when the instruction code (a) is read out from the read-only memory ROM 105, a high level "H" signal appears only on the signal line C1 (while the remaining three signal lines C2, C3 and C4 remain at a low level "L"). In a like manner, when the instruction code (b) is read out, only the signal line C2 rises to a high level "H" so that the second analog switch 16 is turned on, whereby the second analog signal 2 is moved into the A-D converter 30. When the instruction code (c) is read out, the signal line C3 rises to a high level "H" so that the third analog switch 17 is turned on and consequently the third analog signal 3 is transmitted to the A-D converter 30. When the instruction code (d) is read out, only the fourth signal line C4 rises to a high level "H", whereby the digital output signal from the A-D converter 30 is moved into the accumulator ACC 107.

In the read-only memory ROM 105, the first instruction code (a) "11010000" is stored in the memory location with the address 100 while the instruction code (d) "00101100" is stored in the memory location with the address 105. Then the instruction codes (a) and (d) are sequentially read out after four timing fillers NOP, whereby the first analog signal 1 at the first input terminal A1 is converted into a four-bit digital signal which in turn is transferred into the accumulator ACC 107. In a similar manner, the second and third analog signals 2 and 3 may be each converted into a four-bit digital signal which in turn is accumulated in the accumulator ACC 107.

Figure 8:
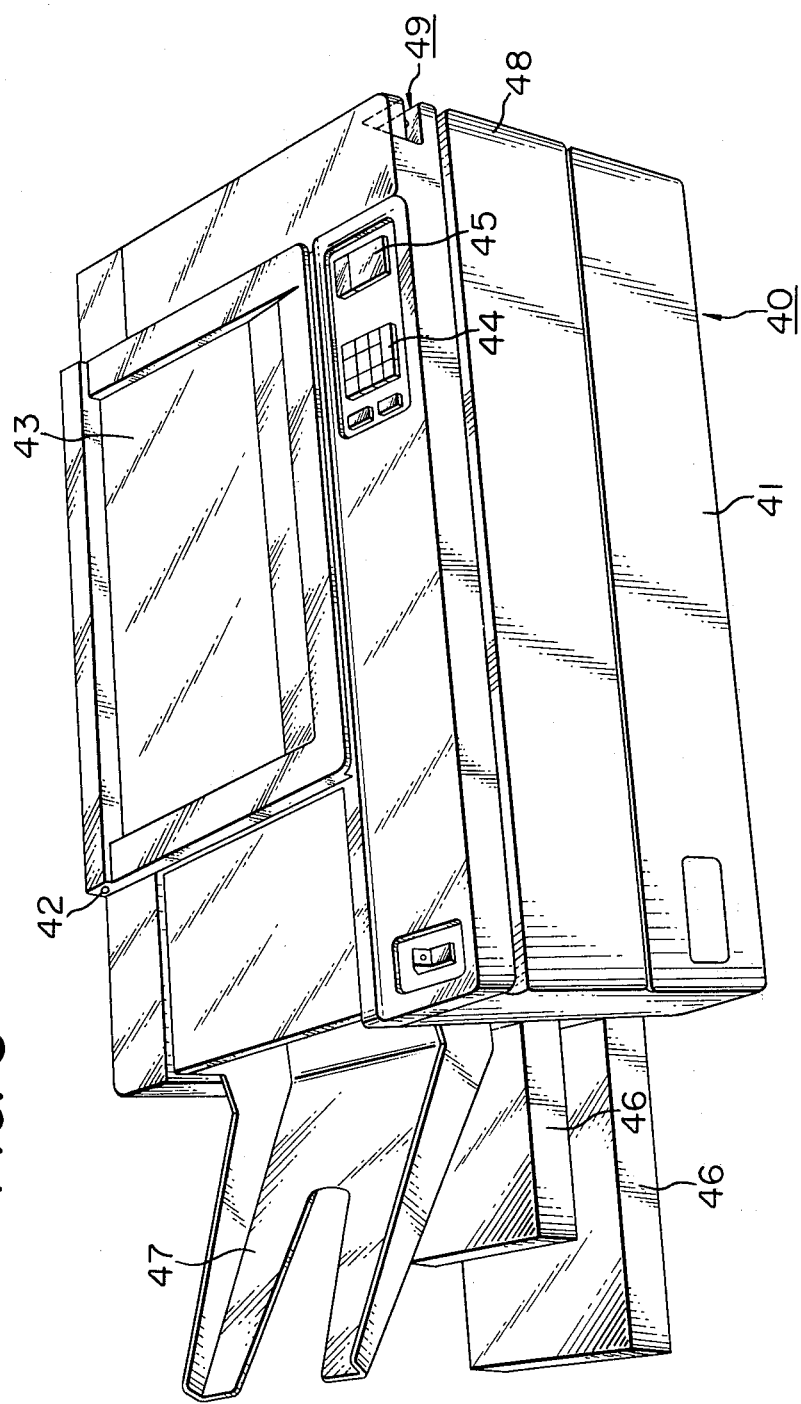
FIG. 8 is a perspective view of a copying machine implementing the present invention.

Copying or Recording Machine, FIGS. 7 through 9

FIG. 7 shows schematically a control unit of a copying or recording machine of the type described in U.S. Pat. No. 3,804,512, assigned to the same assignee, and including the LSI described with reference to FIG. 5. Applied to the first analog signal input terminal A1 of the LSI 32 is the output from a background density sensor 33 for detecting the density of the background of an original to be copied. That is, the voltage across the CdS device 34 is applied to the first terminal A1. Applied to the second input terminal A2 is the output or the voltage across the CdS device 36 of a toner density sensor 35 which detects the density of the toner which is used for developing an electrostatic latent image formed on a photosensitive drum into a visible image. Applied to the third input terminal A3 is the output or the voltage across the thermistor 37' which detects the temperature of a fixing heater which fuses the toner transferred onto a copying sheet of paper.

Therefore a plurality of analog signals which are applied to the LSI 32 may be sequentially read and converted into a digital signal in response to which a control signal such as CHARGER CONTROL, TONER REPLENISH, FIXING HEATER CONTROL or the like may be derived.

FIG. 8 is a perspective view of the copying or recording machine incorporating therein the control unit described above with reference to FIG. 7. The copying machine generally indicated by the reference numeral 40 has a main body 41 upon which is mounted an original holder (not shown) including a pressure plate 43 swingable about a shaft 42. The copying machine 40 further includes among other things a keyboard 44 for setting the number of copies to be reproduced, a start button 45, paper feed cassettes 46 and a copy discharge tray 47.

Figure 9A:
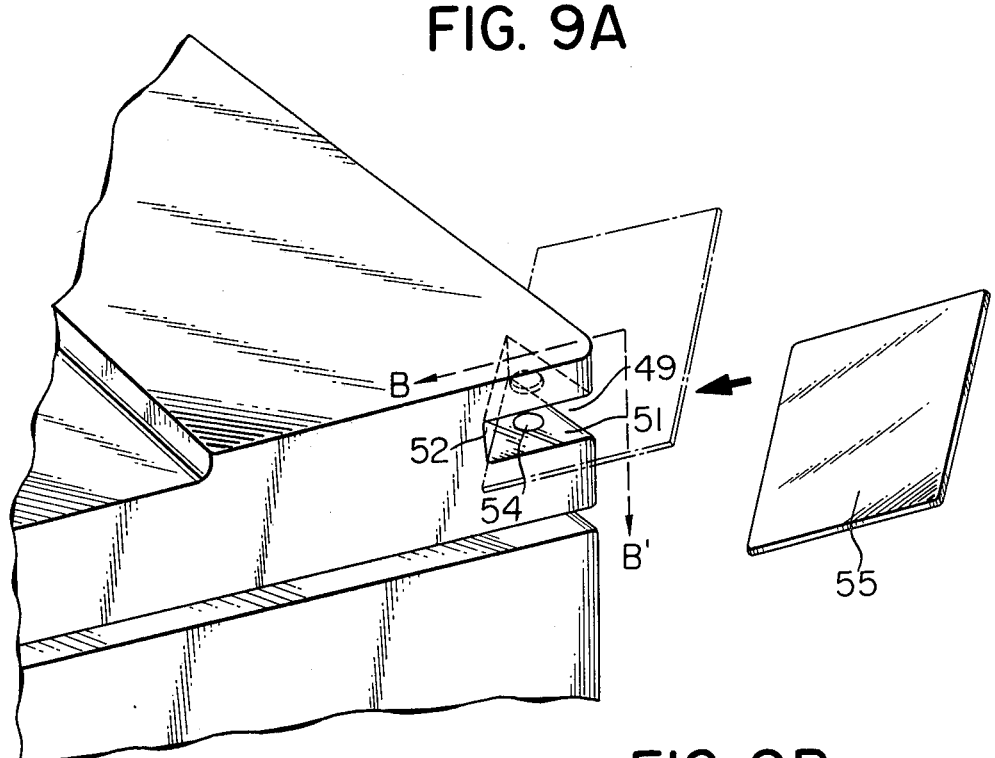
FIG. 9A is a perspective view of a background density sensor which may be used in conjunction with the present invention.
Figure 9B:
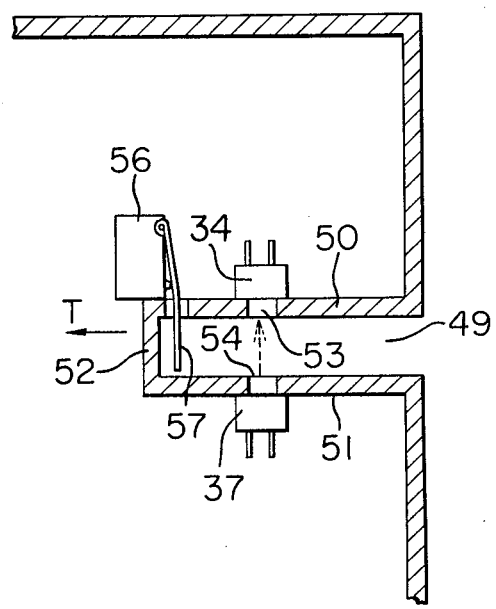
FIG. 9B is a sectional view taken in the direction indicated by arrows B and B' of FIG. 9A.

A triangle notch 49 is formed at one corner 48 of the main body 41. As best shown in FIGS. 9A and 9B, the triangle notch 49 is defined by an upper plate 50, a bottom plate 51 and a vertical plate 52 interconnecting them. Coaxial holes 53 and 54 are formed through the upper and bottom plates 50 and 51, respectively. The CdS device or photosensor 34 is mounted on the upper plate 50 and the light source or lamp 37 is mounted on the bottom plate 51 in such a manner that the light emitted from the lamp 37 is transmitted through these holes 54 and 53 to be received by the CdS photosensor 34. When an original 55 is inserted into the triangular notch 49, the output from the CdS photosensor 34 is in proportion to the amount of light transmitted through the original 55, whereby the density of the background of the original 55 can be detected. The output from the CdS photosensor 34 is applied to the first input terminal A1 as described above, whereby the copying machine will be suitably controlled in response to the density of the background of the original 55.

A switch 56 is mounted on the upper plate 50 on the side of the vertical plate 52 with its actuating arm 57 extended downward into the triangular notch 49 through a hole formed through the upper plate 50. When the original 55 is inserted into the notch 49, the actuating arm 57 is pushed in the direction indicated by an arrow T, whereby the switch 56 is turned on. The output signal from this switch 56 may be used as a trigger signal for converting the output from the CdS photosensor 34 into a digital signal. For instance, in response to the output from the switch 56, the memory location with address 100 in the read-only memory ROM will be accessed (See FIG. 5).

As described above, according to the present invention the combination of a single expensive analog-digital converter with inexpensive analog signal switches results in the hitherto unattainable efficient use of the A-D converter.

So far because of integration density, the number of analog-digital converters which may be implemented together with a microcomputer on a single chip has been limited. According to the present invention, however, a single analog-digital converter implemented together with a microcomputer on one chip may virtually accomplish functions of a plurality A-D converters. Thus the present invention will advantageously meet difficulties of packing density in analog circuit integration.

What we claim is:

1. A device for use in a recording apparatus, comprising:
    means for producing a control signal, said means including integrally on a single semiconductor substrate a read-only memory means for storing therein sequences for use in controlling the operation of the recording apparatus, a random access memory means for storing data temporarily, an arithmetic and logic unit means, input and output ports, and signal transmission lines interconnecting said read-only memory means, random access memory means and arithmetic and logic unit means;
    a plurality of switching circuits, each of said plurality of switching means permitting, when turned on, an analog signal at an input terminal to be transmitted to an output terminal thereof and inhibiting, when turned off, the analog signal from the input from being transmitted to the output terminal;
    an analog-digital conversion circuit having an input connected in common to the output terminals of said plurality of switching circuits and an output connected to said signal transmission lines for converting an analog signal applied to the input into a corresponding digital signal which appears at the output;
    a plurality of analog signal generating means external to the semiconductor substrate for generating analog signals which are applied to said respective plurality of switching circuits;
    a switching signal generating means provided on the semiconcudtor substrate for generating a switching signal for causing a selected one of said plurality of switching circuits to turn on while keeping the remaining switching circuits turned off; and
    an instruction signal generating means for generating an instruction signal for causing a digital signal at the output of said analog-digital conversion circuit to be stored in a part of said control signal producing means after a predetermined, fixed time required for analog-to-digital conversion from when the switching signal is applied to said analog-digital conversion circuit.

2. A device as set forth in claim 1, wherein at least one of said plurality of analog signal generating means comprises a first analog signal generator for generating an analog signal representative of a temperature.

3. A device as set forth in claim 1, wherein at least one of said plurality of analog signal generating means comprises a an analog generator for generating an analog signal representative of the intensity of a detected light.

4. A recording apparatus incorporating an analog-digital converter, comprising:
    means for reproducing an original;
    means for producing a control signal for use in controlling said recording apparatus;
    an analog signal generating means for generating an analog signal in response to which said control signal producing means produces a control signal, said analog signal generating means comprising a light emitting means for emitting light, and a photosensor means positioned to intercept the light transmitted from said light emitting means, said photosensor means being responsive to the light from an original to be reproduced to generate an analog signal representative of the intensity of the intercepted light;
    an analog-digital conversion circuit for converting the analog signal from said analog signal generating means into a digital signal which in turn is applied to said control signal producing means;
    a switching means for selectively transmitting the analog signal from said analog generating means to said analog-digital conversion circuit; and
    a switching signal generating means for generating a switching signal for controlling said switching means.

5. A recording apparatus as set forth in claim 4, further comprising a housing for enclosing said recording apparatus, and a notch formed at a portion of said housing, said analog signal generating means comprising a lamp and a photosensor operatively disposed on either side of said notch.

6. A recording apparatus as set forth in claim 5, further comprising a switching means disposed at said notch to be actuated upon insertion of an original into said notch.

7. A recording apparatus as set forth in claim 6, wherein said switching means is included in said switching signal generating means.

8. A recording apparatus as set forth in claim 4, further comprising an instruction code generating means for generating an instruction code for causing a digital signal at the output of said analog-digital conversion circuit to be stored in a part of said control signal producing means after a predetermined time from when the switching signal is applied to said analog-digital conversion circuit.

9. A recording apparatus incorporating an analog-digital converter, comprising:
    means for recording information;

means for producing a control signal for use in controlling said recording apparatus;

analog signal generating means for generating analog signals to be applied to said control signal producing means, said analog signal generating means including at least a first analog signal generating means for generating a first electrical analog signal representative of a temperature and a second analog signal generating means for generating a second electrical analog signal representative of the intensity of a detected light, each of said first and second analog signals forming, by itself, a signal which is used to affect the operation of said apparatus;

a first switching means for permitting the first analog signal from said first analog signal generating means to be transmitted to an analog-digital conversion circuit;

a second switching means for permitting the second analog signal from said second analog signal generating means to be transmitted to an analog-digital conversion circuit;

an analog-digital conversion circuit responsive to the selected one of said first and second switching means for converting the analog signals into corresponding digital signals which in turn are applied to said control signal producing means; and a switching signal generating means for generating a switching signal in response to which either of said first and second switching means is turned on while the other is kept turned off.

10. Recording apparatus having an analog-digital converter comprising:

recording means for recording information;

control means for controlling the operation of said recording means;

light emitting means for projecting light onto a light-illuminated member;

sensing means for sensing the amount of light obtained from the member illuminated by said light emitting means to produce analog signals associated with the amount of light sensed;

analog-digital conversion means for converting the analog signals produced from said sensing means into digital signals; and instruction means for instructing the digital signals produced from said conversion means to be selectively applied to said control means.

11. Recording apparatus having an analog-digital converter comprising:

recording means for recording information;

control means having at least a memory means, arithmetic logic unit means and an accumulating memory for use in controlling the operation of said recording means;

analog signal generating means for generating analog signals;

analog-digital conversion means for converting the analog signals generated from said analog signal generating means into digital signals; and instruction means for instructing whether or not the digital signals produced from said conversion means are to be stored in said accumulating memory.

* * * * *

UNITED STATES PATENT AND TRADEMARK OFFICE
CERTIFICATE OF CORRECTION

PATENT NO. : 4,222,105

DATED : September 9, 1980

INVENTOR(S) : KATSUICHI SHIMIZO, ET AL.

It is certified that error appears in the above-identified patent and that said Letters Patent are hereby corrected as shown below:

Col. 13, line 65, "semiconcudtor" should read --semiconductor--;

Col. 14, line 15, delete "a"

Signed and Sealed this

Seventeenth Day of March 1981

[SEAL]

Attest:

RENE D. TEGTMEYER

Attesting Officer

Acting Commissioner of Patents and Trademarks